United States Patent [19]

Mizunoue

[11] Patent Number: 5,105,194

[45] Date of Patent: Apr. 14, 1992

[54] TIME SHIFT TWO-STEP ANALOG TO DIGITAL CONVERTER

[75] Inventor: Masashi Mizunoue, Torrance, Calif.

[73] Assignee: Sony Corp. of America, Park Ridge, N.J.

[21] Appl. No.: 647,481

[22] Filed: Jan. 29, 1991

[51] Int. Cl.$^5$ .............................................. H03M 1/14
[52] U.S. Cl. .................................... 341/156; 341/162
[58] Field of Search .............. 341/155, 156, 158, 161, 341/162, 163

[56] References Cited

U.S. PATENT DOCUMENTS

| | | | |
|---|---|---|---|
| 3,483,550 | 12/1969 | Max ...................................... | 341/163 |
| 4,051,469 | 9/1977 | Ninomiya ............................. | 341/172 |
| 4,342,983 | 8/1982 | Weigand et al. ..................... | 341/156 |
| 4,535,319 | 8/1985 | Penney ................................ | 341/156 |
| 4,598,269 | 7/1986 | Penney ................................ | 341/156 |
| 4,973,976 | 11/1990 | Lee et al. ......................... | 341/156 X |
| 4,999,624 | 3/1991 | Pichlik ............................. | 341/156 X |

Primary Examiner—Howard L. Williams
Attorney, Agent, or Firm—Blakely, Sokoloff, Taylor & Zafman

[57] ABSTRACT

A method of and apparatus for high speed, high resolution, time-shift two-step analog-to-digital conversion (ADC) employing only one ADC module for both coarse and fine signal conversions. The same ADC module is used first for the coarse signal conversion with its output signal stored until the ADC completes the slower fine signal conversion to generate the conversion error for the subsequent compensation process. A digital signal is then generated after the two signals are processed by using a digital signal processing to compensate for conversion error.

13 Claims, 2 Drawing Sheets

TIME SHIFT TWO-STEP ANALOG TO DIGITAL CONVERTER

BACKGROUND OF THE INVENTION

1. Field of the Invention

The present invention relates generally to analog-to-digital converting circuits and more particularly to analog-to-digital converting circuits using a two-step, time shift error-compensating technique to achieve high resolution.

2. Art Background

A typical data-acquisition system receives signals from a variety of different sources and transmits these signals in suitable form to a computer or a communication channel. In such systems, a multiplexer is usually employed to select each signal in sequence, and then the analog information is converted into a constant voltage over the gating-time interval by means of a sample-and-hold system. The constant output of the sample-and-hold may then be converted to a digital signal by means of an analog-to-digital (A/D) converter for digital transmission. Therefore, a basic A/D converting circuit would require a sample-and-hold element and an A/D converting element to convert an analog signal into a series of digital signals.

In the field of high resolution analog-to-digital conversion, the A/D conversion is usually developed with two step conversion techniques. FIG. 1 shows a typical A/D converter structure in the prior art. As shown in FIG. 1, a train of analog input signals is first applied through a sample-and-hold mechanism 10 to produce a train of discrete signals, which are then converted to digital signals ("coarse signal") and stored in a digital signal processor for processing. The size of the digital signal n is dependent upon the A/D converter 11.

To detect conversion errors, the same digital signals are then converted back to analog signals through a D/A converter 12 with its output signals applied to the negative input of a subtracter unit 13. To adjust for the timing difference, the output from the sample-and-hold mechanism 10 is delayed through a delay mechanism 16 with its output applied to the positive input of a subtracter unit 13. The difference of these two signals, which represents the error from the conversion, is then converted in another A/D converter 14 under the same conversion rate to produce another n bits of digital signals ("fine signal") and stored in a digital signal processor 15 for processing.

An error-compensating circuit such as a digital signal processor 15 (DSP) is then used to compensate the conversion error resulted from the non-linearity of the circuit by comparing between the coarse and the fine signals. The least significant bit (LSB) of the signal from the coarse A/D converter and the most significant bit (MSB) of the signal from the fine A/D converter are compared and the conversion error is corrected by the DSP. The desired digital output contains (2n−1) bits, where n is dependent upon the A/D converter. As will be seen in the following description, the presently claimed invention employs only one set of A/D and D/A components to achieve the same high resolution A/D conversion.

SUMMARY OF THE INVENTION

Therefore it is an object of the present invention to provide a method of and apparatus for high-speed, high-resolution, time-shift A/D conversion utilizing only one set of A/D and D/A module for both coarse and fine signal conversions.

It is further an object of the present invention to provide an apparatus for high-speed, high resolution, time shift A/D conversion.

The analog signals are first converted into digital signals (coarse signals) by the A/D converter and stored in memory for further processing by an error-compensating circuit. The conversion error is detected by converting into digital signals (fine signals) through the same A/D converter the difference between the sample-and-hold output signal and the D/A output signal. Better accuracy of the fine signals is achieved by using a charge-coupled device as a delay, which allows the fine conversion to proceed at a slower rate. The conversion error is then compensated by processing both the fine and coarse digital signals through an error-compensating circuit to produce the desired digital output signal.

BRIEF DESCRIPTION OF THE DRAWINGS

The objects, features and advantages of the present invention will be apparent from the following detailed description in which.

DETAILED DESCRIPTION OF THE INVENTION

A method of and apparatus for high-speed, high-resolution analog-to-digital conversion is described. As will be described in more detail hereinafter, the method and apparatus disclosed herein is one which converts an analog signal into a digital signal in a time shift, two-step manner utilizing only one set of A/D and D/A modules. As can be readily differentiated from the prior art in the following description, the method and apparatus disclosed utilize the same A/D module for both fine and coarse signal conversion to achieve high resolution. Furthermore in a high speed circuit such as the one described herein, signal timing is critical because both the A/D and D/A units require several clock periods to generate output. In the apparatus of the present invention the timing can be adjusted to maximize the speed of the circuit by minimizing timing delays. As will be further appreciated from the following description, the presently claimed invention allows the conversion speed of the fine signals to be slower than that of the coarse conversion, whereas the prior art circuits require timing adjustment for both fine and coarse conversion speeds to be the same.

In the following description, numerous specific details are set forth, such as specific size of the signals, etc., in order to provide a thorough understanding of the present invention. However, it will be obvious to one skilled in the art that the present invention may be practiced without the specific details. In other instances, well-known circuits have not been described in detail in order not to unnecessarily obscure the present invention.

Figure 1:
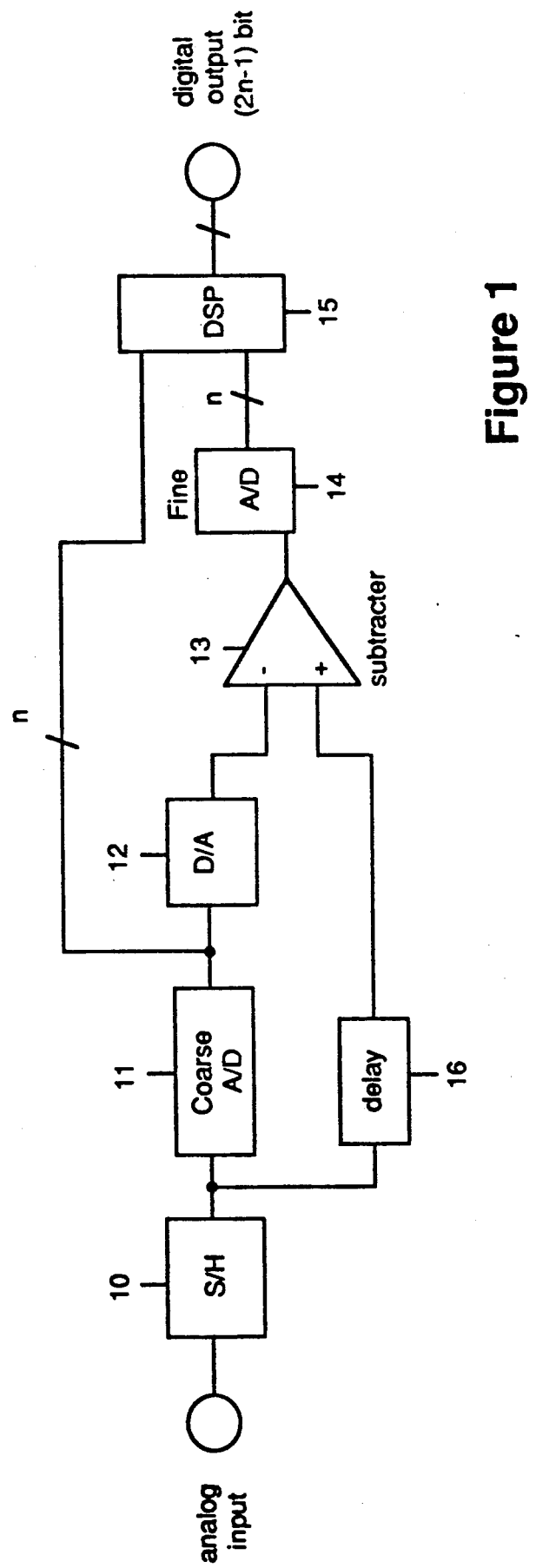
FIG. 1 is a schematic diagram illustrating the analog-to-digital converter circuit in the prior art.
Figure 2:
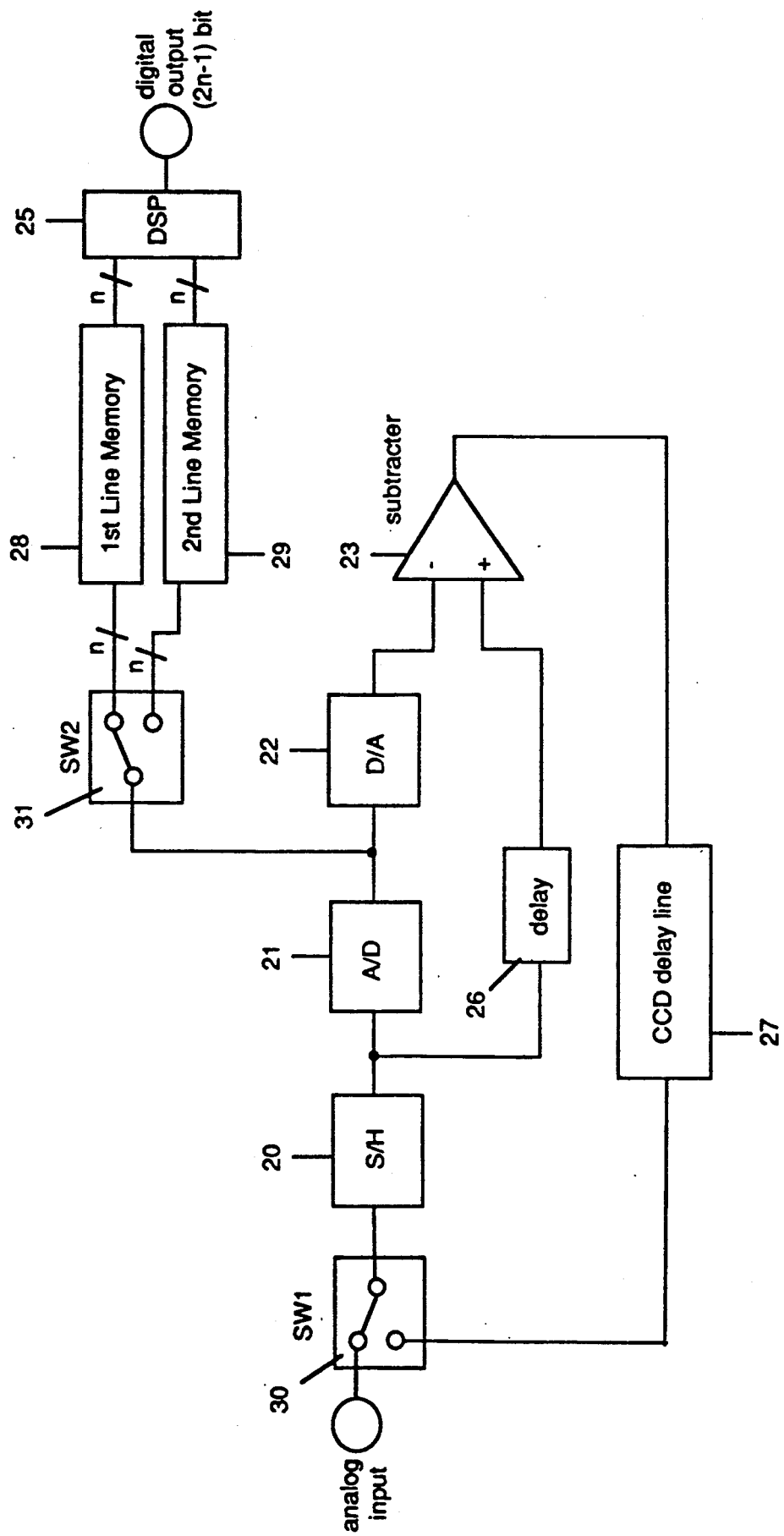
FIG. 2 is a schematic diagram illustrating the analog-to-digital converter circuit in the presently claimed invention.

Reference is now made to FIG. 2, where the schematic block diagram of the presently claimed invention is shown. First, with proper coupling of switch SW1 30, a train of analog signals is applied to a sample-and-hold (S/H) mechanism 20 to produce a train of discrete signals, which are then converted to digital signals (coarse signal) by the analog-to-digital (A/D) converter 21. Currently, S/H 20 holds the analog input signals during the A/D and D/A signal processing time frame; however, the settling time for the subtracter and the fine A/D conversion time may also be included in the "hold" time. Through the coupling of switch SW2 31, the digital signals are then stored in a line memory unit 28 for further processing. The size of the digital signal can be any number of bits, depending upon the A/D converter 21 and the input signals.

To detect and correct the digital conversion errors, the same digital output signals from the A/D converter 21 are also converted back to analog signals by using the digital-to-analog (D/A) converter 22, with its output applied to the negative input port of a subtracter unit 23. The same sample-and-hold output analog signal is delayed through the delay line 26 to adjust for the timing difference due to the A/D and D/A delay and applied to the positive input port of the subtracter unit 23. If a charge coupled device-like delay unit is used, then the sample-and-hold sampling speed can be equal to the speed of the A/D converter 21 or the settling time of the CCD input stage, whichever is greater to adjust for the transient stage. The subtracter unit 23 then outputs a train of analog signals equal to the difference between the sample-and-hold signal and the converted analog signal of the first digital signal, which represents the conversion error in analog form. This form of error detection is well known in the art of A/D conversions; however, it will be apparent to those skilled in the art that other error detection schemes are available.

Referring again to FIG. 2, the A/D conversion further requires storing and delaying the analog difference signal in a second analog delay line 27 until proper coupling of switch SW1 can be made to allow this analog signal to input to the sample-and-hold mechanism 20. Preferably, the delay line 27 is an analog memory shifter, such as a charge-coupled device (CCD) delay line. A CCD has the effect of stabilizing the signals to eliminate "ringing" because of its nature that the amount of charge coupled is proportional to the signal sample stored. Furthermore, the signal input to the CCD can be adjusted to output the same at a lower frequency by use of the CCD multiphase clocks. By lowering the frequency, the number of samples per period taken by the S/H mechanism of the signal is increased thereby providing a greater accuracy of digital samples of the signal without modifying the S/H mechanism. As already previously described, the analog signal will first be sampled-and-held in the S/H mechanism 20 and then be converted to a digital signal (fine signal), in the A/D converter 21, having the same number of bits as the coarse signal. With the proper coupling of switch SW2 31, the digital signal is stored in a second line memory unit 29 for further processing. Thus the same circuitry used to sample the coarse signal is used to sample the fine signal. Furthermore by lowering the frequency of the fine analog signal through CCD the sample rate is effectively slowed down such that the sample-and-hold dynamic characteristics can be improved resulting in better accuracy of the fine signal and the amount which represents the error in conversion, because the difference between consecutive signals is reduced. Better accuracy of the fine signal provides a more precise sampling of the fine signal and allows a more effective error compensation process subsequently.

With the arrival of the digital signal in line memory unit 29, the error correcting circuit, such as a digital signal processing (DSP) unit, processes both the coarse and fine signals stored in line memory units 28 and 29 to compensate for the error caused by the nonlinearity of the circuit. After the signal processing, a desired $(2n-1)$ bit digital signal is generated at the output of the digital signal processor 25. Currently, the DSP unit compares the Least Significant Bit (LSB) of the coarse digital signal with the Most Significant Bit (MSB) of the fine digital signal; however, it will be obvious to those skilled in the art that other digital signal processing schemes would achieve the same objectives. Furthermore, currently both the fine and coarse digital signals are stored in line memory units prior to processing by the DSP; however, it will be apparent to those skilled in the art to implement a DSP which is capable of stalling unit both fine and coarse signals are present for processing.

While the invention has been described in conjunction with the preferred embodiment, it is evident that numerous alternations, modifications, variations and uses will be apparent to those skilled in the art in light of the foregoing description.

I claim:

1. A method for converting an analog signal to a digital signal in a data-acquisition system, comprising the steps of:

providing analog-to-digital (A/D) converting means comprising sample-and-hold (S/H) means for converting a first analog signal into a discrete signal, and A/D converter for converting said discrete signal into a first digital signal;

inputting said first analog signal into said A/D converting means, wherein said A/D converting means converts said first analog signal into said first digital signal;

detecting conversion errors comprising;

inputting said first digital signal to digital-to-analog (D/A) converting means for converting said first digital signal into a second analog signal;

delaying said discrete signal by using a first delay means to generate a first delayed signal of said discrete signal to adjust for timing difference between said discrete signal and said second analog signal; and inputting said first delayed signal and said second analog signal to subtracter means for generating a third analog signal, said third analog signal being said first delayed signal subtracted by said second analog signal;

delaying said third analog signal outputting from said subtracter means by using second delay means to produce a second delayed signal of said third analog signal until such a time when said A/D converting means is ready to accept said third analog signal;

outputting at a frequency slower than the frequency of the third analog signal said second delayed signal to said A/D converting means, wherein said second delayed signal is converted into second digital signal by said A/D converting means and the accuracy of the second digital signal is greater than the accuracy of the first digital signal to provide a more precise digital representation of the second delayed signal; and error-processing said first digital signal and said second digital signal such that said conversion errors are compensated and an output signal is generated.

2. A method according to claim 1, wherein said first digital signal and said second digital signal are stored in first and second memory means before being processed to compensate for conversion errors.

3. A method according to claim 2, wherein said first digital signal and said second digital signal are stored in said first and second memory means respectively by using a first switching means, said first switching means coupling said first digital signal to said first memory means and said second digital signal to said second memory means at a first predetermined time interval.

4. A method according to claim 3, wherein said first analog signal and said second delayed signal are applied to said A/D converting means by using a second switching means, said second switching means coupling said first analog signal and said second delayed signal to said A/D converting means at a second predetermined time interval.

5. A method according to claim 1, wherein said second delay means for generating said second delayed signal for inputting into said A/D means is an analog shift memory.

6. An A/D converting method according to claim 5, wherein said second delay means is a charge-coupled device delay line.

7. An A/D converting method according to claim 1, wherein the step of outputting to said A/D converting means comprises switching between said first analog signal and said second delayed signal and said error-processing step comprises switching between said first and second digital signals and comparing a least significant bit of said first digital signal with a most significant bit of said second digital signal.

8. An analog-to-digital ("A/D") converting circuit for converting a first analog signal into a digital output signal in a data acquisition system, said circuit comprising:

A/D converting means for converting said first analog signal to a first digital signal, said A/D means comprising sample-and-hold (S/H) means for converting said first analog signal into a discrete signal, an A/D converter for converting said discrete signal into said first digital signal;

conversion error detecting means for detecting conversion error between said first analog signal and said first digital signal, said conversion error detecting means comprising;

digital-to-analog (D/A) converting means for converting said first digital signal into a second analog signal;

first delay means for generating a first delayed signal of said discrete signal from said S/H means such that the timing difference between said discrete signal and said second analog signal is avoided; and subtracter means for generating a third analog signal, said third analog signal being said first delayed signal subtracted by said second analog signal;

second delay means for generating a second delayed signal by delaying said third analog signal, said second delayed signal being applied at a frequency slower than the frequency of the third analog signal to said A/D means to generate a second digital signal, wherein the accuracy of the second digital signal is greater than the accuracy of the first digital signal to provide a more precise digital representation of the second delayed signal;

a first switching means for allowing inputs to said A/D means to be switched from between said first analog signal and said second delayed signal;

error-compensating means for processing said first and second digital signals; and a second switching means for allowing inputs to said error-compensating means to be switched from between said first and second digital signals for thereafter processing by said error-compensating means such that said conversion errors are compensated and an output digital signal is generated.

9. An A/D converting circuit according to claim 8, further including first and second means for storing said first and second digital signals respectively prior to applying said signals to said error compensating means.

10. An A/D converting circuit according to claim 9, wherein said second switching means for allowing inputs to said storing means to be switched from between said first and second digital signals for thereafter processing by said error compensating means.

11. An A/D converting circuit according to claim 8, wherein said second delay means is an analog shift memory.

12. An A/D converting circuit according to claim 11, wherein said second delay means is a charge-coupled device delay line.

13. An A/D converting circuit according to claim 8, wherein said error-compensating means processes said first and second digital signals by comparing a least significant bit of said first digital signal with a most significant bit of said second digital signal.

* * * * *